United States Patent
Zhang

(10) Patent No.: US 8,251,549 B2
(45) Date of Patent: Aug. 28, 2012

(54) LED MODULE

(75) Inventor: Hai-Wei Zhang, Shenzhen (CN)

(73) Assignees: Fu Zhun Precision Industry (Shen Zhen) Co., Ltd., Shenzhen. Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 507 days.

(21) Appl. No.: 12/558,600

(22) Filed: Sep. 14, 2009

(65) Prior Publication Data

US 2010/0328958 A1    Dec. 30, 2010

(30) Foreign Application Priority Data

Jun. 30, 2009   (CN) .......................... 2009 1 0303872

(51) Int. Cl.
*F21V 3/00* (2006.01)
(52) U.S. Cl. ................... 362/311.02; 362/246; 362/311; 362/311.06; 362/311.1; 359/707

(58) Field of Classification Search .................. 362/326, 362/246, 310.02, 335, 244, 311; 359/707, 359/708, 710
See application file for complete search history.

(56) References Cited

U.S. PATENT DOCUMENTS

| | | | |
|---|---|---|---|
| 7,126,273 B2 * | 10/2006 | Sorg | 313/512 |
| 7,180,252 B2 * | 2/2007 | Lys et al. | 315/312 |
| 7,273,299 B2 * | 9/2007 | Parkyn et al. | 362/244 |
| 7,594,840 B2 * | 9/2009 | Sorg | 445/25 |
| 7,748,872 B2 * | 7/2010 | Holder et al. | 362/308 |
| 7,825,613 B2 * | 11/2010 | Ye et al. | 315/312 |
| 2004/0126913 A1 * | 7/2004 | Loh | 438/26 |
| 2005/0269587 A1 * | 12/2005 | Loh et al. | 257/99 |

* cited by examiner

*Primary Examiner* — Ali Alavi
(74) *Attorney, Agent, or Firm* — Altis Law Group, Inc.

(57) ABSTRACT

An LED module includes an LED and a lens fixed with the LED for refracting light emitted by the LED. The lens has a center axis and a concaved inner face for incidence of the light and an opposite convex outer face for the light refracting out thereof. A peak intensity for light generated by the LED occurs within 52-67 degrees off the center axis when the light leaves the outer face.

15 Claims, 4 Drawing Sheets

LED MODULE

BACKGROUND

1. Technical Field

The present disclosure relates generally to a light emitting diode (LED) module, and more particularly to an LED module for lighting.

2. Description of Related Art

An LED lamp which is related to a solid-state lighting utilizes LEDs as a source of illumination, providing advantages such as resistance to shock and nearly limitless lifetime under specific conditions.

LED lamps have been applied for street lighting recently. Generally, the light from the LEDs has been adjusted by a reflector to illuminate along a predetermined direction. However, such adjustment cannot increase an illuminate area. Further, such adjustment remains a peak intensity of the light occurring around a center axis of each of the LEDs, which easily resulting in a discomfort glare, increasing a potential danger for the traffic safety.

What is need therefore is an LED module adopted in an LED lamp having a design which can overcome the above limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
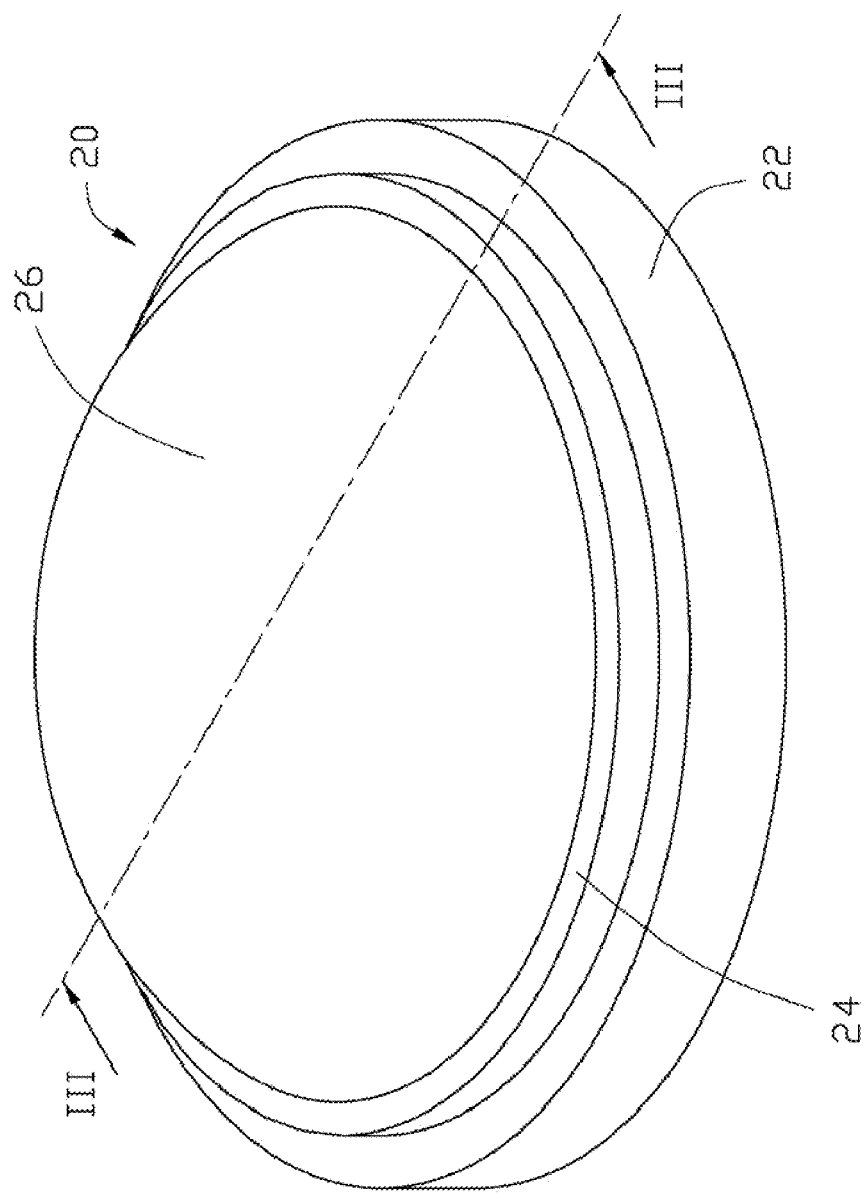
FIG. 1 is an isometric, assembled view of an LED module in accordance with an embodiment of the present disclosure.
Figure 2:
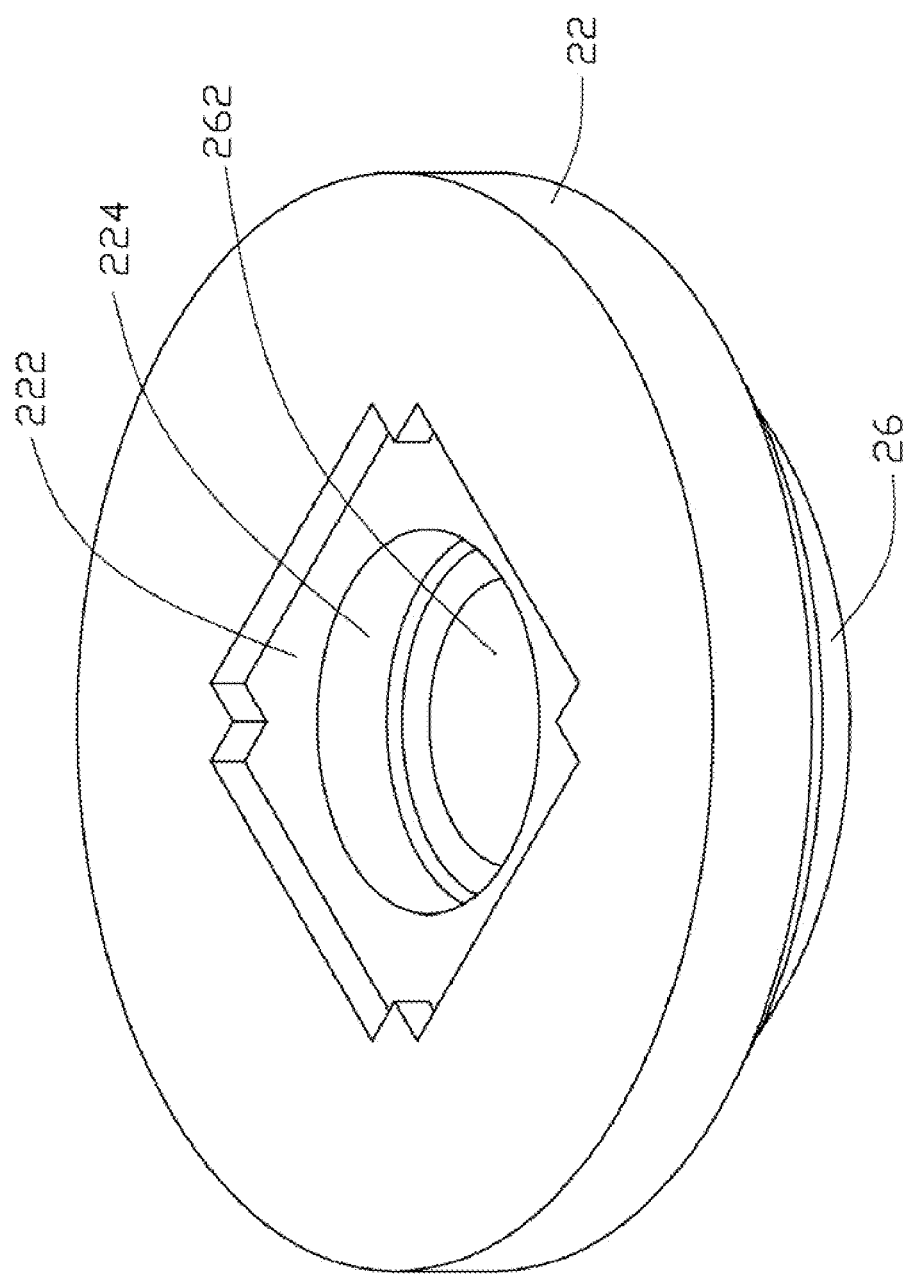
FIG. 2 is an inverted view of the LED module of FIG. 1, with an LED thereof being removed away.
Figure 3:
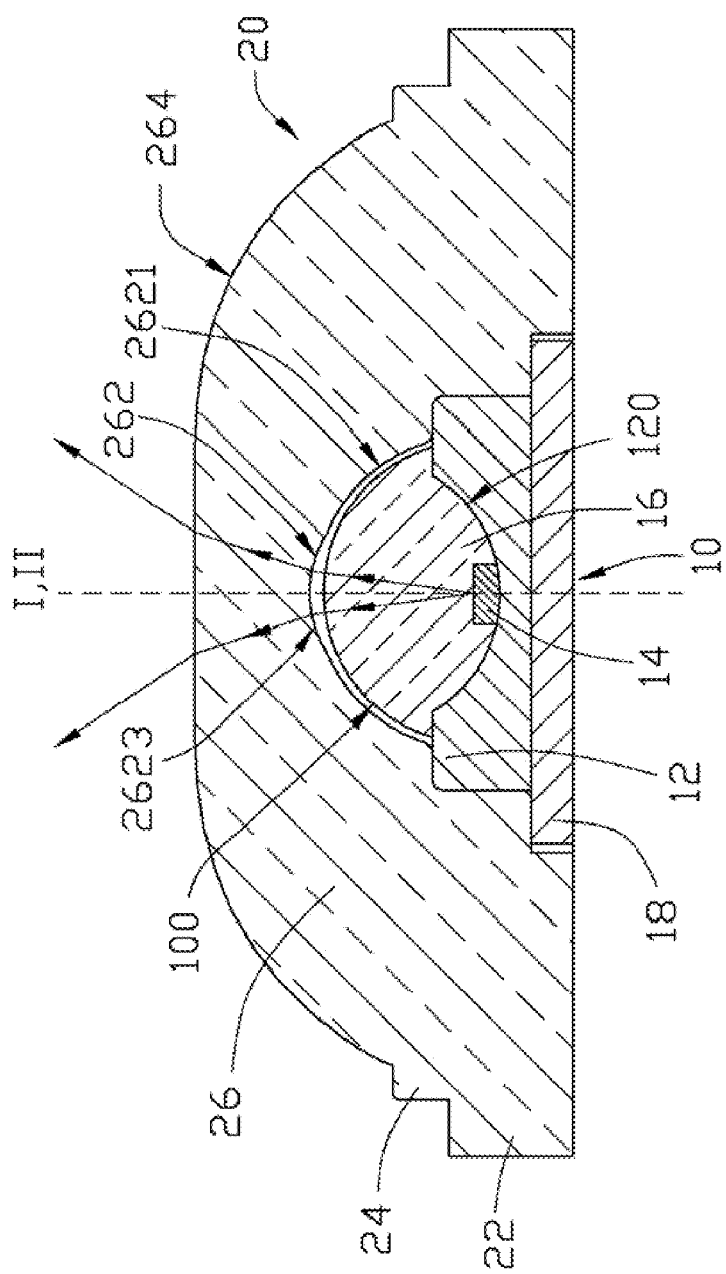
FIG. 3 is a cross-sectional view of the LED module of FIG. 1, taken along line thereof.

FIGS. 1 to 3 illustrate an LED module in accordance with an embodiment of the present disclosure. The LED module is utilized in a lighting fixture and comprises an LED 10 and a lens 20 covering the LED 10.

The LED 10 comprises a round base 12 with a concave 120 defined in a top thereof, an LED chip 14 received in the concave 120, a transparent envelope 16 fixed on the top of the base 12 and sealing the LED chip 14 in position, and a rectangular board 18 disposed on a bottom of the base 12. The envelope 16 has a substantially hemispherical outer surface to form a light extraction face 100 of the LED 10. The LED 10 has a center optical axis I substantially perpendicular to the base 12. A surface of the concave 120 can reflect the light generated by the LED chip 14 to concentrate upwardly. Thus, a peak intensity of the light exists around the center axis I of the LED 10.

The lens 20 is integrally made of a transparent material with good optical performance, such as PMMA or PC. The lens 20 also has an optical axis II which is coincident with the optical axis I of the LED 10. The lens 20 is centrosymmetric relative to the axis II. The lens 20 comprises a circular supporting part 22, a dome-shaped light direct part 26 and a connecting part 24 connecting the supporting part 22 and the light direct part 26. The connecting part 24 has an annular shape, and is homocentric with and smaller than the supporting part 22. A cross groove 222 is defined in a middle of a bottom of the supporting part 22 for receiving the board 18 of the LED 10. A cylindrical hollow 224 is further defined in the middle of the bottom of the supporting part 22 and over the groove 222, for receiving the base 12 of the LED 10 therein.

The light direct part 26 is located on a middle top portion of the connecting part 24. The light direct part 26 has a concaved inner face 262 at a bottom thereof and an opposite convex outer face 264 at a top thereof. A space defined by the concaved inner face 262 is exposed to the hollow 224 and used for receiving the envelope 16 of the LED 10 therein. The inner face 262 is provided for an incidence of the light from the LED 10, and the outer face 264 is provided for refracting the light to achieve a desired light-directing optical performance. A small gap is defined between the light extraction face 100 of the LED 10 and the inner face 262 of the lens 20. The light from the LED 10 enters into the inner face 262 and penetrates through the outer face 264 to radiate an outside of the LED module. In the present embodiment, the inner face 262 is spherical and comprises a main sphere 2621 and a secondary sphere 2623 located at a middle of a top of the main sphere 2621. A radius of the main sphere 2621 is larger than that of the secondary sphere 2623. Centers of the main sphere 2621 and secondary sphere 2623 are both on the axis I (thus also on the axis II). FIG. 3 shows two schematic light beams through the secondary sphere 2623, which is refracted by the secondary sphere 2623 away from the axis I, thereby reducing a light intensity around the axis I. The outer face 264 is an irregular surface, which can be understood as a compound irregular surface consisted of certain different surfaces. In the present embodiment, the outer face 264 has an approximately sphere/spheroid surface located at a bottom thereof and connected with the connecting part 24, and an approximately plane surface located at a top thereof, middle of which being slightly depressed downwardly. The approximately sphere/spheroid surface and the approximately plane surface are connected together smoothly and no sharp angle is defined therebetween. A curvature radius of any point of the outer face 264 is larger than that of the inner face 262. The light direct part 26 as well as the whole lens 20 is increasing gradually in thickness from the axis II to a periphery thereof.

Figure 4:
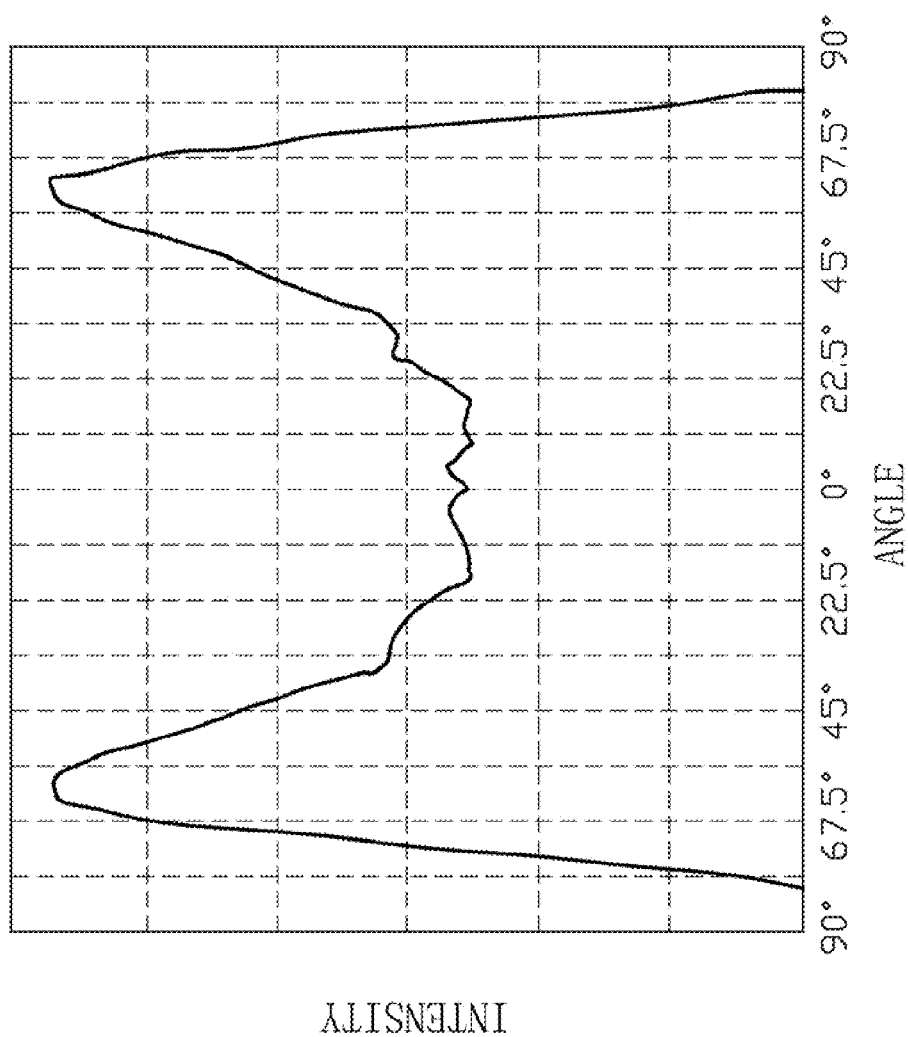
FIG. 4 is a graph of light intensity vs. angle for the LED module of FIG. 1.

FIG. 4 shows a curve of the light intensity vs. angle for the LED module. After the light being refracted by the lens 20 to leave the outer face 264, the peak light emission for the LED 10 occurs within 52-67 degrees off the axis I. A range between 60-63 degrees is preferred. The light emission along the axis I is 43%-48% of the peak emission. The brightness within 0-25 degrees offsetting the axis I has no sharp transitions. Half-peak light emission for the LED 10 occurs within 20-25 degrees and 70-75 degrees off the axis I. When the light off the axis I more than 67 degree, the light intensity decreases sharply. The light brightness turns to be zero when the light offs the axis I close to 82 degree.

As described above, since the half-peak intensity of the light occurring at a large degree offsetting the axis I, i.e., 70-75 degrees, the LED module can illuminate a larger area compared with the conventional ones. Further, in the illumination range, the light intensity has no sharp transitions, in which the minimum light intensity reaches at 43%-48% of peak intensity. Thus, the light can be uniformly distributed over the illumination areas, which avoiding the glare generated by the sharp transitions of light intensity.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. An LED module comprising:
an LED; and
a lens fixed with the LED for refracting light emitted by the LED, the lens having a center axis and a concaved inner face for incidence of the light and an opposite convex outer face for the light refracting out thereof;
wherein a peak intensity for the LED in leaving the convex outer face occurs within 52-67 degrees off the center axis; and
wherein the lens comprises a supporting part, a light direct part and a connecting part connecting the supporting part and the light direct part, the supporting part defining a groove at a bottom thereof for receiving the LED, the light direct part being curved to form the inner face and outer face of the lens at bottom and top thereof, respectively.

2. The LED module as claimed in claim 1, wherein an intensity of the light along the center axis in leaving the convex outer face is 43%-48% of the peak intensity.

3. The LED module as claimed in claim 1, wherein the peak intensity occurs within 60-63 degrees off the center axis.

4. The LED module as claimed in claim 3, wherein a half-peak intensity occurs within 20-25 degrees and 70-75 degrees off the center axis.

5. The LED module as claimed in claim 1, wherein the light intensity decreases sharply when the light offsets from the center axis larger than 67 degree.

6. The LED module as claimed in claim 1, wherein the inner face of the lens is spherical, and the outer face of the lens is an irregular surface.

7. The LED module as claimed in claim 6, wherein a curvature radius of the outer face is larger than that of the inner face.

8. The LED module as claimed in claim 6, wherein the inner face comprises a main sphere and a secondary sphere located at a middle top of the main sphere, and a radius of the main sphere being larger than that of the secondary sphere, centers of the main sphere and the secondary sphere being on the center axis.

9. The LED module as claimed in claim 7, wherein the irregular surface comprises an approximately sphere/spheroid surface located at a bottom thereof and an approximately plane surface at a top thereof.

10. The LED module as claimed in claim 1, wherein the lens increases in thickness from the center axis to a periphery thereof.

11. An LED module comprising:
an LED; and
a lens fixed with the LED for refracting light emitted by the LED, the lens having a center axis and a concaved inner face for incidence of the light and an opposite convex outer face for the light refracting out thereof;
wherein a peak intensity for the LED in leaving the convex outer face occurs within 52-67 degrees off the center axis;
wherein the inner face of the lens is spherical, and the outer face of the lens is an irregular surface; and
wherein the inner face comprises a main sphere and a secondary sphere located at a middle top of the main sphere, and a radius of the main sphere being larger than that of the secondary sphere, centers of the main sphere and the secondary sphere being on the center axis.

12. An LED module comprising:
an LED;
a lens fixed with the LED for refracting light emitted therefrom, a center axis of the lens and a center axis of the LED being coincidental, the lens being symmetric with the center axis of the lens and having an inner face for incidence of the light and an opposite outer face for the light refracting out thereof;
wherein a peak intensity of the light refracted from the lens occurring within 52-67 degrees off the center axis of the lens when the light leaves the outer face; and
wherein the inner face comprises a main sphere and a secondary sphere located at a middle top of the main sphere, and a radius of the main sphere being larger than that of the secondary sphere, centers of the main sphere and the secondary sphere being on the center axis of the lens, and wherein the outer face comprises an approximately sphere/spheroid surface located at a bottom thereof and an approximately plane surface at a top thereof.

13. The LED module as claimed in claim 12, wherein an intensity of the light along the center axis of the lens when the light leaves the outer face is 43%-48% of the peak intensity.

14. The LED module as claimed in claim 12, wherein the peak intensity occurs within 60-63 degrees off the center axis of the lens.

15. The LED module as claimed in claim 14, wherein a half-peak intensity occurs within 20-25 degrees and 70-75 degrees off the center axis of the lens.

* * * * *